United States Patent
Keller et al.

(10) Patent No.: US 6,473,247 B1
(45) Date of Patent: Oct. 29, 2002

(54) OPTICAL LENS SUPPORT AND METHOD FOR USING SAME

(75) Inventors: Gerhard Keller, Saint Maur; Gérard Willemin, Champigny; Michel Mace, Chelles; Gilles Menges, Commercy; Patrick Lametairie, Champigny; Jean-Claude Duon, Mondeville; Pedro Ourives, Pontault-Combault, all of (FR)

(73) Assignee: Essilor International, Charenton le Pont (FR)

( * ) Notice: Subject to any disclaimer, the term of this patent is extended or adjusted under 35 U.S.C. 154(b) by 0 days.

(21) Appl. No.: 09/786,399

(22) PCT Filed: Sep. 2, 1999

(86) PCT No.: PCT/FR99/02093

§ 371 (c)(1), (2), (4) Date: May 9, 2001

(87) PCT Pub. No.: WO00/14295

PCT Pub. Date: Mar. 16, 2000

(30) Foreign Application Priority Data

Sep. 4, 1998 (FR) ............................................. 98 11099

(51) Int. Cl.$^7$ ......................... G02B 7/02; B05C 11/02; B05C 13/00; B05C 13/02; B05C 21/00

(52) U.S. Cl. ........................ 359/819; 118/52; 118/500

(58) Field of Search ................................. 359/811, 819; 204/192.12, 192.13, 192.15, 192.23; 427/240; 118/52, 500

(56) References Cited

U.S. PATENT DOCUMENTS

| 2,532,971 | A |   | 12/1950 | Van Leer et al. ............ 427/162 |
| 5,124,019 | A |   | 6/1992 | Kunkel et al. ......... 204/298.15 |
| 5,325,812 | A | * | 7/1994 | Thiebaud et al. ............ 118/500 |
| 5,374,315 | A | * | 12/1994 | Deboer et al. ............... 118/725 |
| 5,660,693 | A | * | 8/1997 | Abramson et al. ..... 204/192.12 |

FOREIGN PATENT DOCUMENTS

EP 0 547 312 6/1993

* cited by examiner

Primary Examiner—Jordan Schwartz
Assistant Examiner—William Choi
(74) Attorney, Agent, or Firm—Young & Thompson

(57) ABSTRACT

The invention concerns a support of the type comprising at least a first base (13), and, borne by the latter, for maintaining such an optical lens (10) at its edge (11), at least three support pins (14A, 14B). The invention is characterized in that the base comprises, for its own support, a plane support surface (16) whereof the peripheral outline (P1) is globally circular, its radial dimension (D1) along a particular radius (R) of said support surface (16) is at least equal to its axial dimension (D2) perpendicularly to the plane thereof. The invention is particularly useful for maintaining an optical lens in a processing apparatus using spin coating technique.

28 Claims, 5 Drawing Sheets

OPTICAL LENS SUPPORT AND METHOD FOR USING SAME

The present invention relates generally to optical lens supports and more particularly to ophthalmic lens supports.

It is standard practice to treat ophthalmic lenses after fabricating them to confer particular characteristics on them, for example abrasion resistance and/or antireflection properties. This is known in the art.

In the present context, and in the usual way, the expression "ophthalmic lens" refers to a blank from which an eyeglass lens to be mounted in an eyeglass frame is then obtained by trimming.

The blank usually has a circular peripheral contour but this is not necessarily always the case.

The following description must therefore be considered to apply to any contour.

Be this as it may, applying a treatment to an ophthalmic lens usually entails depositing at least one layer of material onto its surface and it is obviously important for the deposit to be very uniform.

An antireflection deposit is usually applied in a vacuum.

This is the case, for example, in U.S. Pat. No. 2,532,971, in which ophthalmic lenses to be treated are each disposed in an individual support for holding them throughout their treatment.

The treatment in practice entails rotating the ophthalmic lenses at a relatively moderate speed, which is of the order of 50 rpm, about the rotation axis of a collective support to which the combination of the lens and its support is attached.

The individual support for each ophthalmic lens includes a base and three bearing studs carried by the base for holding an ophthalmic lens by its edge, one of which studs is fixed relative to the base, although its position relative thereto may be adjustable, and the other two of which are individually carried by elastically deformable arms carried by the base.

In practice the base takes the general form of a globally circular contour ring whose radial dimension, i.e. whose dimension in the direction of its thickness, and therefore in the plane of its edges, is very much less than its height, i.e. its dimension perpendicular to that plane.

In practice, the individual support in the general form of a ring, which itself has to be fixed into a ring, is never operative through the edge of its base.

More recent implementations are substantially the same, for example that described in U.S. Pat. No. 5,325,812, in which an individual ophthalmic lens support of the above kind is in practice reduced to a simple elastically deformable ring adapted to be fixed into a rigid support ring.

Another technique for depositing a layer of material, usually referred to as spin coating, has been developed for other types of substrate, namely silicon wafers used in the field of microelectronics, whereby the substrate is rotated and a small quantity of material is deposited on its surface.

The rotation speed of the substrate during the spreading of the material is relatively high, and higher than its speed of rotation during deposition of the material, and is in practice always greater than 1500 rpm, in order to spread the material correctly over the whole of the surface of the substrate.

Because of the high rotation speed used, it is obviously important for the individual supports of the substrates to be treated to be properly seated inside the corresponding apparatus.

For applying a treatment to an ophthalmic lens by spin coating, a support in the general form of a ring of the kind which is usually employed at present for holding an ophthalmic lens, as outlined above, would obviously not be suitable, because of its poor seating.

German patent application No. 38 38 012 describes a support for applying a treatment by spin coating to an ophthalmic lens, including three clamping members each of which consists of a support finger which receives the ophthalmic lens and a clamping finger which clamps the lens, with a flyweight system that varies the pressure applied to the lens according to the rotation speed.

The overall result is a particularly complex implementation.

A general object of the present invention is an optical lens support which, in contrast, provides a simple way of holding an optical lens correctly, even within apparatus using the spin coating deposition technique.

That optical lens support, which is of the kind including at least one first base and, carried thereby, for holding an optical lens by its edge, at least three bearing studs, is generally characterized in that, the base including, for its own seating, a plane bearing surface whose peripheral contour is globally circular, its radial dimension along any radius of that bearing surface is at least equal to its axial dimension perpendicular to the plane thereof.

There is obtained in this way a seating surface sufficient to enable use of the support in apparatus implementing the spin coating technique. The support can in particular be fixed by its single bearing surface on a turntable of the spin coating apparatus forming a pneumatic sucker, i.e. incorporating a plurality of suction orifices holding the base against said turntable by applying suction to its bearing surface.

It is even advantageously possible, thanks to the optical lens support according to the invention, to use existing apparatus, without any significant adaptation thereof, so obtaining the benefit in the field of optical lenses of a technology already proven in another field.

Generally speaking, it is advantageously possible, thanks to the optical lens support in accordance with the invention, to accommodate relatively high rotation speeds.

From this point of view, another object of the present invention is a method of using the support characterized in that it involves rotating the support and the optical lens it is carrying at a rotation speed greater than 500 rpm.

In a first embodiment, at least one of the three bearing studs is fixed relative to the base and at least one other is carried by an elastically deformable member itself carried by the base.

For at least some applications two of the bearing studs of the optical lens support in accordance with the invention are preferably fixed, only the third of the bearing studs being carried by an elastically deformable member.

It is therefore advantageously possible to control better the elastic force to which the optical lens is subjected even though, given the temperature to which it is subjected, which can be as high as 100° C., and the fact that the elastic force is applied to its edge, which can be very thin, for some prescriptions at least, the optical lens can be made dangerously more fragile, so that it is desirable to protect it.

The bearing studs of the optical lens support in accordance with the invention are preferably operative along a circumference that is eccentric to the periphery of the base, i.e. relative to the periphery of the bearing surface thereof, the center of this circumference being nearer the fixed bearing stud or studs than the center of that periphery.

Good results have been obtained with the optical lens in its support off-centered in this way.

The base of the optical lens support according to the invention preferably has a central opening and the fixed bearing stud or studs are preferably on its border whereas the bearing stud or studs carried by an elastically deformable member are preferably inside the contour of the central opening.

It is therefore advantageously possible to treat both faces of the optical lens continuously, merely by turning over the combination of the lens and its support.

Furthermore, when two fixed bearing studs are used in this way, unwanted vibration in use is advantageously reduced, which has the benefit of improving the stability of the combination during the corresponding rotation.

Finally, the relatively small thickness of the base of the optical lens support according to the invention is also advantageous and beneficial in that it enables the support to be stored on edge in a storage rack having regularly spaced grooves into each of which a support can be inserted.

In a second embodiment the three bearing studs are fixed to the base and each has a radial bearing face and an axial bearing face, the axial bearing faces of the various studs offering a seat to the periphery of the lens in a specific plane parallel to the bearing surface of the base. The lens is held more rigidly and more reliably in this case, especially at high rotation speeds.

Because the base is in the form of a solid disk, the seating plane offered by the axial bearing faces of the studs is at a slight distance from the other face of the base.

Because the base takes the general form of a disk with a central opening delimited by an inside edge substantially the same shape and substantially the same size as the lens, each bearing stud is made in two parts, having a first part that projects from the other side of the base and features the radial bearing face of the stud concerned and a second part which projects radially from the inside edge of the base. The base then advantageously takes the general form of a disk with a central opening delimited by an inner edge substantially the same shape and substantially the same size as the lens and the bearing studs are each made in two parts, having a first part that projects from the other side of the base and features the radial bearing face of the stud concerned and a second part that projects radially from the inside edge of the base.

The second part of each stud is advantageously in one piece with the base. The beveled axial bearing faces therefore offer a pseudo-conical seat to the lens, which reduces its contact with these axial bearing faces to a line, or even a point, on its peripheral edge. This protects its lower face from any contact that could damage its surface treatment.

In accordance with an advantageous feature constituting an improvement to the invention, and still in the case where the three bearing studs are fixed, the support includes a second base, similar to the first one, provided with at least three bearing studs for holding the lens and having, for its own seating, a plane bearing surface whose peripheral contour is globally circular, its radial dimension along any radius of that bearing surface being at least equal to its axial dimension in a direction perpendicular to the plane thereof; the studs of the second base have axial bearing faces for seating the lens in a plane parallel to the bearing surface of the base for its own seating; the two bases are provided with means for assembling them in a superposed arrangement, with the bearing surface of each base facing away from the other base, so that the two seatings offered by the axial bearing faces of the studs of the two bases sandwich the periphery of the lens.

The lens is therefore sandwiched between the two bases, the axial bearing faces of the studs of each of which offer it a seating in a plane parallel to their bearing surface. The whole of the support, with its two bases and the lens placed between them, can therefore be turned over to treat the two faces of the lens successively. To treat a first face of the lens, the support is disposed so that the first base is under the second base, with its bearing surface resting on the turntable of the apparatus, the lens resting on the axial bearing faces of the studs of the first base. After treating this first face of the lens, the support assembly is turned over so that its second base is under the first base, with its bearing surface resting on the turntable of the apparatus. The lens then rests on the axial bearing face of the studs of the second base and its second face can be treated.

The two seating planes offered by the axial bearing faces of the studs of the two bases are then advantageously separated by a distance slightly greater than the thickness of the lens and the lens has some axial clearance between the two seating planes associated with the two bases. In this case, regardless of the position of the support, the upper face of the lens is entirely disengaged from the axial bearing faces of the studs of the base which is above it and its lower face, which is not treated, is only in contact with the axial bearing faces of the studs of the base that are resting on the turntable of the spin coating apparatus.

The means for assembling the two bases together advantageously make use of the bearing studs. The bearing studs therefore have a second function, contributing to assembling the two bases.

In an advantageous embodiment utilizing this feature, the bearing studs of the first base each include a lug parallel to the central axis, opposite the bearing surface of the base, and which carries the radial bearing face of the stud concerned, and the studs of the second base each include a post carrying the axial bearing face of the stud concerned and having an axial housing to receive the lug of a corresponding stud of the first base.

When axial clearance is required between the seating planes associated with the two bases, the separation of the two bases, and therefore of the two seating planes which are offered by the axial bearing faces of their studs, is preferably determined by abutment of the free end of the lugs of the studs of the first base against the back of the housings of the posts of the studs of the second base.

According to another advantageous feature, the axial bearing faces of the studs of the second base are beveled. As previously explained for the studs of the first base, the fact that the axial bearing faces of the studs of the second base are beveled offers the lens a pseudo-conical seating that reduces its contact with these axial bearing faces to a line, or even a point, on its peripheral edge. Its lower face, which may have just been treated before turning the support over, is therefore protected against any contact that could damage its surface treatment.

In a preferred embodiment, each of the two bases has the general form of a disk with a central opening in it delimited by an inside edge substantially the same shape and substantially the same size as the lens.

The invention, its features and its advantages emerge from the following description, which is given by way of example and with reference to the accompanying diagrammatic drawings, in which.

As shown in the figures, the overall aim is to retain an optical lens 10 correctly.

The optical lens 10, which is more precisely an ophthalmic lens, is a concave-convex lens, for example.

However, it could equally well be a biconcave or biconvex lens, for example.

Figure 1:
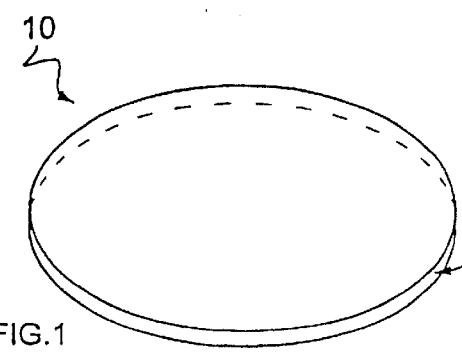
FIG. 1 is a perspective view of an optical lens for which the support in accordance with the invention is intended.
Figure 2:
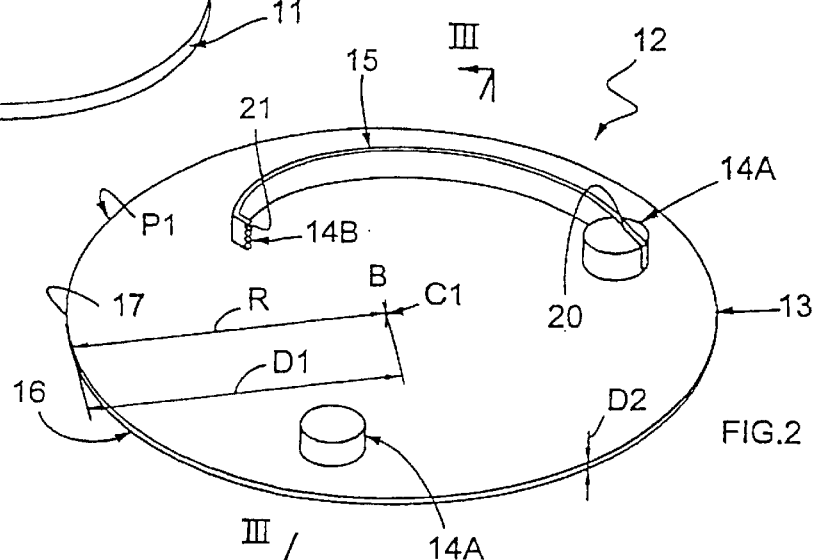
FIG. 2 is a perspective view of the support in a first embodiment of the invention, in which the support includes a mobile stud.

In the embodiment more particularly represented in FIG. 1, it is a circular contour optical lens 10, for example.

In practice, the optical lens 10 constitutes a blank from which an eyeglass lens with a contour matching that of the rims or surrounds of an eyeglass frame to which it is to be fitted is machined by trimming it to shape.

Its edge 11 is relatively thick or relatively thin, depending on the prescription.

The support 12 used to hold an individual optical lens 10 of this kind correctly includes a base 13 and at least three bearing studs 14A, 14B carried by the base, for gripping an optical lens 10 by its edge 11, at least one of the studs being fixed relative to the base 13 and at least one other being carried by an elastically deformable arm 15 in turn carried by the base 13.

There are only three bearing studs 14A, 14B in the embodiments shown.

In accordance with the invention, the base 13 includes a plane bearing surface 16 for seating it whose peripheral contour Pi is globally circular and whose radial dimension D1 along any radius R of the bearing surface 16 is at least equal to its axial dimension D2 in a direction perpendicular to the plane thereof.

In practice the radial dimension D1 of the base 13 is a multiple of its axial dimension D2, for example up to ten times the latter dimension.

For example the radial dimension D1 is from 50 to 60 mm and the axial dimension D2 is from 1 to 5 mm.

However, the above numerical values are given here by way of example only, of course, without being in any way limiting on the invention.

In the embodiment more particularly represented in FIGS. 1 to 4, the base 13 is a flat and solid disk whose bottom surface forms the bearing surface 16.

It has a center C1.

In practice this is the center of the peripheral contour P1 of its bearing surface 16 and corresponds to the rotation center of the support 12.

In the embodiment more particularly represented in FIGS. 1 to 4, two of the bearing studs 14A, 14B are fixed and only the third stud is carried by an elastically deformable arm 15.

The bearing studs 14A are fixed and the bearing stud 14B is carried by an elastically deformable arm 15.

For example, and as shown, the fixed bearing studs 14A are cylindrical bosses whose cross section is circular and whose generatrices are perpendicular to the base 13.

Figure 3:
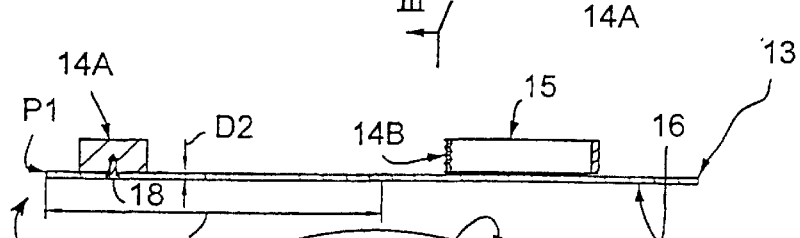
FIG. 3 is a view of it to a larger scale and in cross section taken along the line III—III in FIG. 2.

In the embodiment shown, the two fixed bearing studs 14A are identical and are sections of right cylinders each of which is attached to the base 13 by any appropriate fixing means 18, for example a screw (see FIG. 3).

In the embodiment more particularly shown in FIGS. 1 to 4, the elastically deformable arm 15 carrying the third bearing stud 14B has its root anchored into one of the fixed bearing studs 14A.

For example, and as shown, the elastically deformable arm 15 is formed by a leaf spring whose width is perpendicular to the plane of the bearing surface 16 of the base 13.

In practice the root of the elastically deformable arm 15 is nested in the fixed bearing stud 14A that carries it, by means of a cut 20 in the fixed bearing stud 14A, and extends freely and cantilever-fashion therefrom, along a contour which is globally in the shape of a circular arc, over a circular sector subtending an angle at the center greater than 45°, for example of the order of 90°.

In the embodiment shown, the bearing stud 14B carried in this way by an elastically deformable arm 15 is in one piece with the latter, forming a single component with the elastically deformable arm 15.

In practice, the bearing stud 14B is simply formed by a right-angle return at the free end of the elastically deformable arm 15, directed toward the center C1 of the base 13.

At least one of the resulting bearing studs 14A, 14B preferably has at least one localized notch 21 for improved retention of the optical lens 10.

In the embodiment more particularly represented in FIGS. 1 to 4 this is the case only for the bearing lug 14B carried by an elastically deformable arm 15, which in practice has several notches 21 which are staggered along its height and each of which has a V-shaped profile.

In the embodiment shown, the fixed bearing studs 14A are smooth.

At rest, i.e. in the absence of an optical lens 10, the bearing studs 14A, 14B are preferably disposed along a circumference P2 that is eccentric relative to the peripheral contour P1 of the bearing surface 16 of the base 13, the center C2 of the circumference P2 being nearer the fixed bearing studs 14A than the center C1 of the peripheral P1.

For example, the resulting eccentricity of the center C2 of the circumference P2 on which the bearing studs 14A, 14B are situated at rest relative to the center C1 of the peripheral contour P1 of the bearing surface 16 of the base 13 is from 1 to 5 mm and preferably of the order of 1 to 2 mm.

However, as previously, these numerical values are given here only by way of example, with no possibility of limiting the invention in any way.

The base 13 is made of metal, for example, and likewise the elastically deformable arm 15.

The base 13 can be made of aluminum, for example.

However, it can be made from a synthetic material if the operating temperature allows this.

The fixed bearing studs 14A can also be made from a synthetic material if the operating temperature allows it.

Figure 4:
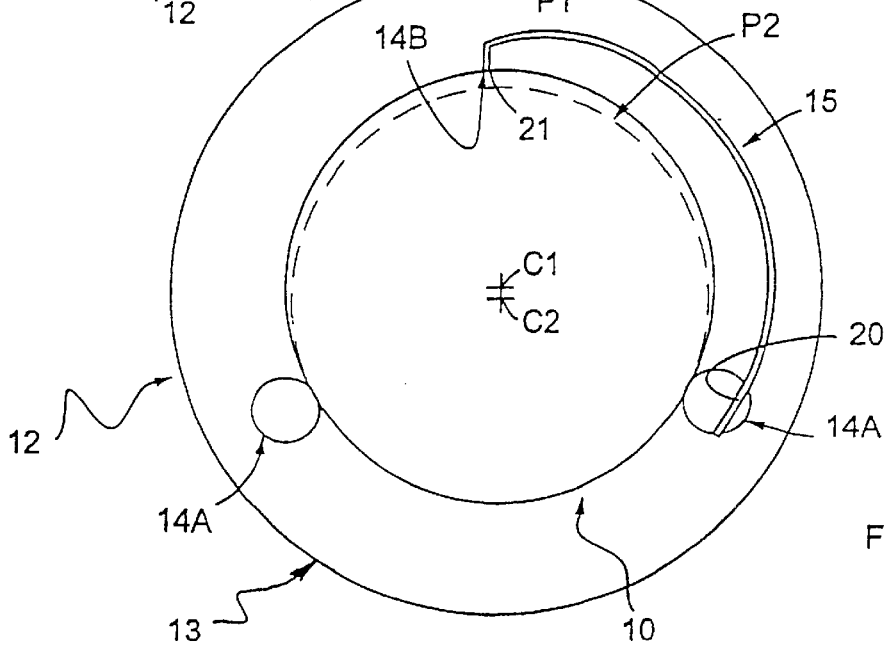
FIG. 4 is a plan view showing the placing of an optical lens on the support.

Be this as it may, in use, and as shown in FIG. 4, the edge 11 of the optical lens 10 to be held is simply inserted between the fixed bearing studs 14A and the bearing stud 14B carried by an elastically deformable arm 15, which causes it to locate positively against the fixed bearing studs 14A, along a generatrix of each of them.

For example, the radial force exerted for this purpose by the elastically deformable arm 15 is from 1 to 10 N and preferably of the order of 2 N.

In the embodiments shown in FIGS. 5 to 8, the base 13 has a large central aperture 23 and therefore has the general form of a washer.

The bearing surface 16 is formed by its top or bottom surface.

The fixed bearing stud or studs 14A are on the border of the central opening 23 and the bearing stud or studs 14B carried by an elastically deformable arm 15 are inside its contour.

For example, and as shown, there are two fixed bearing studs 14A and one bearing stud 14B carried by an elastically deformable arm 15, as previously.

Figure 6:
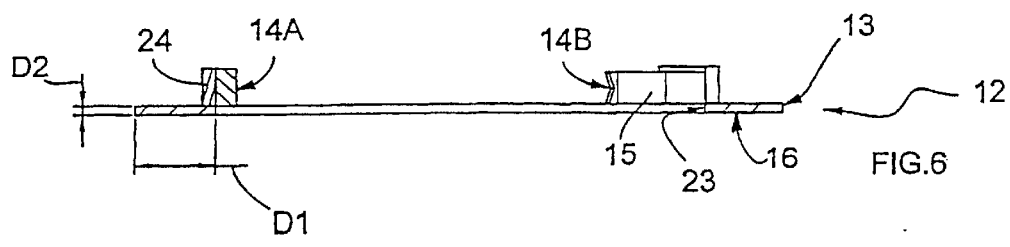
FIG. 6 is a view of the second embodiment in cross section taken along the line VI—VI in FIG. 5.

In the embodiment more particularly represented in FIG. 6, the fixed bearing studs 14A are entirely on the same side of the base 13, and likewise the bearing stud 14B carried by an elastically deformable arm 15.

In the embodiment represented, the fixed bearing studs 14A are each individually fastened to a flange 24 by means of which they are attached to the base 13.

As previously, they are sections of smooth right cylinders.

In the embodiment shown, the elastically deformable arm 15 is bent on itself, in practice with a V-shaped elbow, between its root and the bearing stud 14B that it carries.

It is a leaf spring, as previously.

In the embodiment shown, the root of the elastically deformable arm 15 is fastened to a flange 25 by means of which it is attached to the base 13, like the fixed bearing studs 14A.

Figure 5:
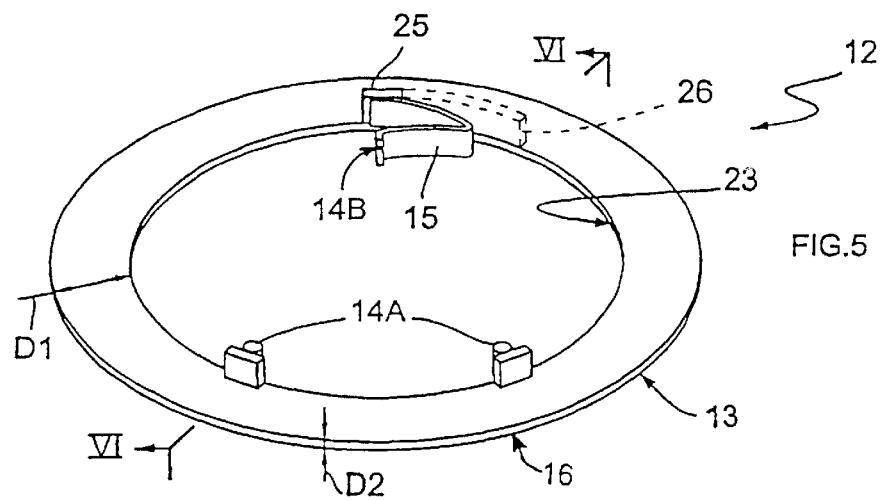
FIG. 5 is a perspective view analogous to that of FIG. 2, showing a second embodiment of the invention.

If required, and as represented in dashed line in FIG. 5, the flange 25 can have an extension 26 which extends circumferentially along the base 13 on the same side as the elastically deformable arm 15, to brace the arm if necessary.

Finally, and as previously, the bearing stud 14B carried by the elastically deformable arm 15 is in one piece therewith, being formed by a right-angle return at its free end.

Figure 7:
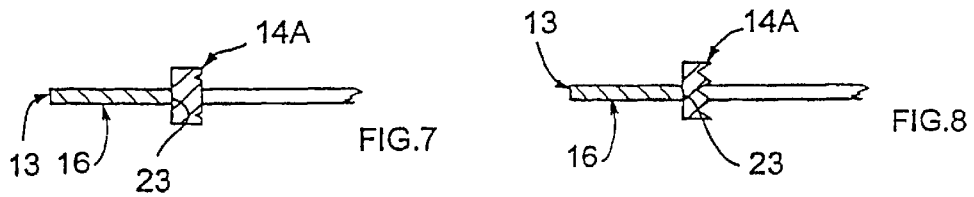
FIGS. 7 and 8 are partial views in cross section analogous to that of FIG. 6 and respectively corresponding to third and fourth embodiments of the invention.
Figure 8:
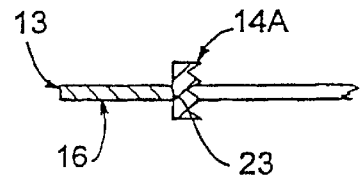

In the embodiments shown in FIGS. 7 and 8 the fixed bearing studs 14A are on either side of the base 13, being simply in contact with and fastened to the inside edge of the central opening 23 therein.

For example, in FIG. 7, and as previously, they are sections of right cylinders which are smooth or incorporate one or more localized notches.

Alternatively, FIG. 8, at least one of the fixed bearing studs 14A is notched over all its height, and likewise the associated bearing stud 14B, if required.

Of course, the bearing stud 14B preferably also extends to either side of the base 13.

Be this as it may, in accordance with the invention, when the base 13 is in the general form of a washer like this, its radial dimension D1 remains at least equal to its axial dimension D2, being in practice a multiple thereof.

Figure 9:
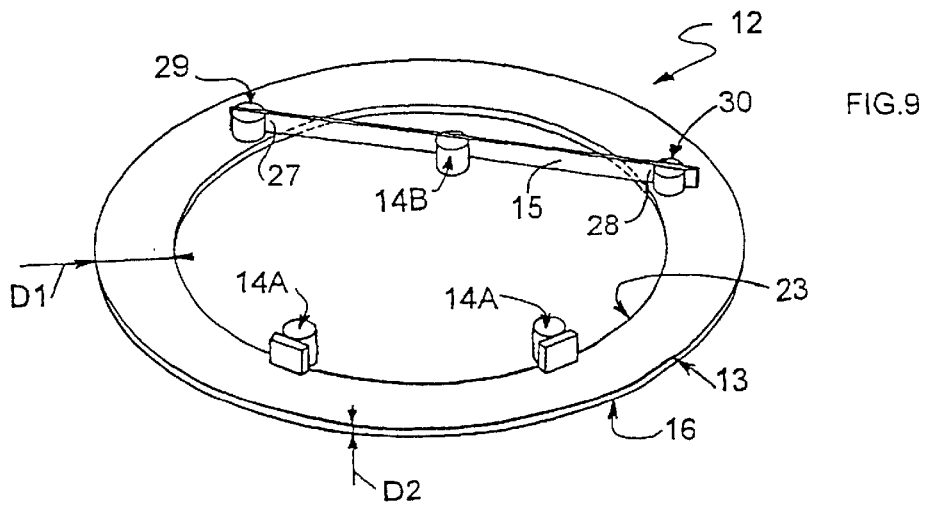
FIG. 9 is a plan view of the support in a fifth embodiment of the invention.

FIG. 9 shows an embodiment analogous to those of FIGS. 5 to 8. The base 13 therefore includes a large central opening 23, as previously, and is in the general form of a washer. The bearing surface 16 is formed by its bottom surface. The fixed bearing studs 14A are at the border of the central opening 23.

The mobile bearing stud 14B is carried by an elastically deformable member 15. However, differing in this respect from the embodiments shown in FIGS. 5 to 8, the member 15 here takes the form of a simple straight or slightly curved leaf spring, each end of which cooperates with the border of the central opening 23, and which carries the mobile bearing stud 14B at its center.

To be more precise, in the example shown, the leaf spring 15 has two ends 27, 28 which are fastened to the base 13 by embedding them in two corresponding blocks 29, 30 attached to the base 13. To be more precise, the end 28 of the leaf spring 15 is not strictly speaking embedded in the block 30 but has some freedom of movement in the longitudinal direction of the leaf spring 15. The leaf spring 15 can therefore flex with a high stiffness suited to holding a lens firmly between the mobile bearing stud 14B and the two fixed bearing studs 14A.

The mobile bearing stud 14B takes the form of a section of right cylinder and is either smooth or provided with asperities.

Figure 10:
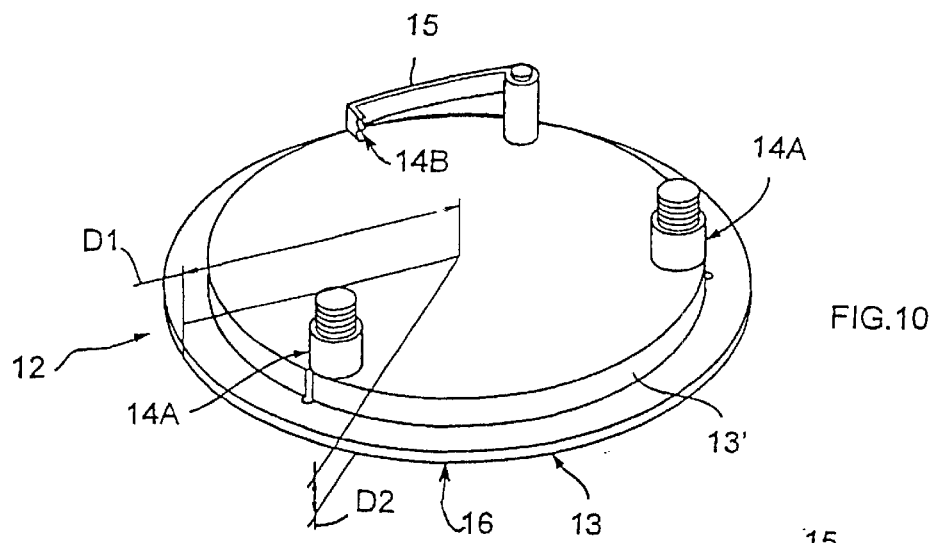
FIG. 10 is a perspective view analogous to that of FIG. 2 and relates to a sixth embodiment of the invention.

In the embodiment shown in FIG. 10, as in the embodiment shown in FIGS. 1 to 4, the base 13 is a solid disk.

However, in this embodiment the base 13 is stepped, with a thicker part 13' in its middle area carrying the bearing studs 14A, 14B.

However, in accordance with the invention, the radial dimension D1 of the base 13 remains at least equal to its axial dimension D2.

Otherwise, the features are substantially the same as those described with reference to FIGS. 1 to 4.

However, in the embodiment shown, the angle subtended at the center of the circular sector around which the elastically deformable arm 15 extends is very much less than 90°, for example of the order of 45°.

Furthermore, in the embodiment shown, the fixed bearing studs 14A have a smooth cylindrical base whose diameter is greater than that of their upper part, which features striations or notches.

Figure 11:
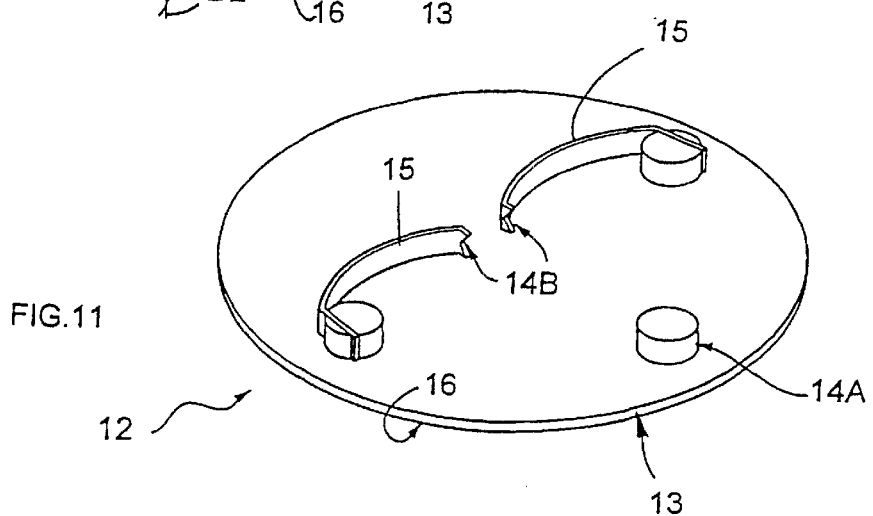
FIG. 11 is a perspective view, also analogous to that of FIG. 2, and relates to a seventh embodiment of the invention.
Figure 12:
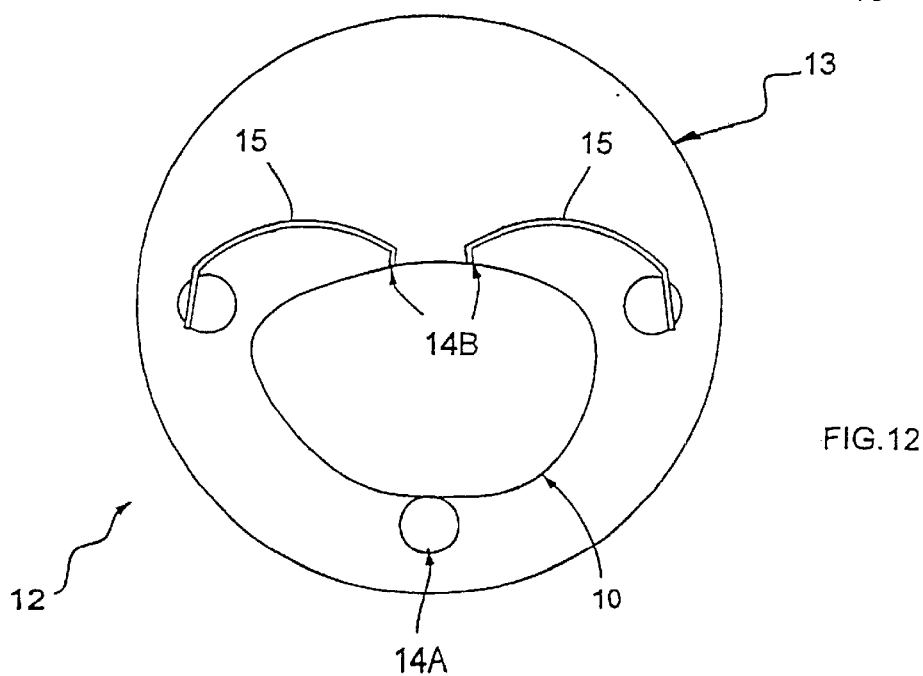
FIG. 12 is a plan view showing the use of the seventh embodiment.

In the embodiment shown in FIGS. 11 and 12, two bearing studs 14A, 14B are each carried by a respective elastically deformable arm 15, only the third one being fixed.

In other words, in this embodiment there is a single fixed bearing stud 14A and two bearing studs 14B carried by elastically deformable arms 15.

Otherwise, the features are substantially the same as those described with reference to FIGS. 1 to 4.

However, there is a difference in that the corresponding support 12 is adapted to hold an optical lens 10 whose contour is not circular.

Figure 13:
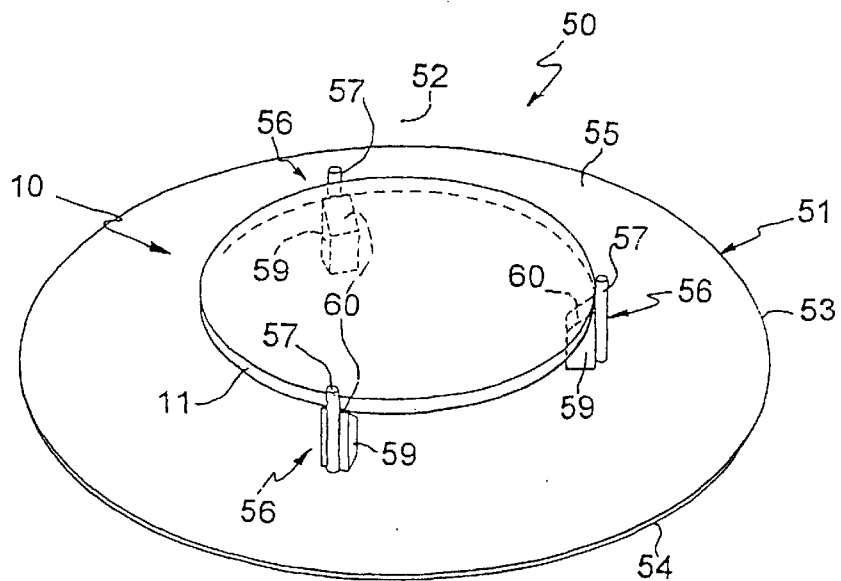
FIG. 13 is a perspective view of an optical lens support in an eighth embodiment of the invention, in which all of the studs are fixed to the base.

FIG. 13 shows another embodiment of the invention in which the studs are fixed to the base.

To be more precise, in this embodiment the support 50 includes a base 51 which takes the form of a solid disk with a central axis 52 and a circular contour 53 concentric with that axis. The base disk 51 has a first face 54 which is in practice its bottom face and constitutes a bearing surface for seating it on the turntable of the spin coating apparatus. As previously, and as follows from the inherent nature of any disk, the base disk 51 has a radius very much greater than its thickness. The base disk 51 therefore offers a bearing surface 54 which is sufficiently large for it to be fixed in a stable manner, for example by a system of pneumatic suckers on the turntable of the spin coating apparatus.

The base disk 51 has a second face 55 on the side opposite its first face 54 and which is in practice its top face.

The base disk 51 has three identical bearing studs 56 projecting from its top face 55 and regularly spaced around the central axis 52 to form a seat for holding the lens 10.

To be more precise, each of the three studs 56 consists of a lug 57 in the form of a cylindrical rod whose bottom end is inset into the base disk 51 and which extends parallel to the axis 52, i.e. vertically, and a block 59 which is fixed at its base to the top face 55 of the base disk 51 and which has a beveled top face 60, i.e. a top face in a plane oblique to the faces 54 and 55 of the base disk 51, i.e. to the horizontal. In this instance the top face 60 of the block 59 is inclined at an angle of approximately 50° to the horizontal. The top faces 60 of the blocks 59 are disposed so that they converge toward the central axis 52, toward the base disk 51, i.e. downward, to offer a pseudo-conical seat to the lens 10.

Each stud 56 therefore has a radial bearing face for the lens 10 consisting of the lateral surface of the lugs 57 and an axial bearing face consisting of the top face 60 of the blocks 59.

The fact that the axial bearing faces 60 of the blocks 56 are beveled reduces the contact between the lens and the studs 56 to a line or even a point at the border of the lens, which protects the integrity of the entire bottom face of the lens 10. This arrangement also improves the stability of the seating of the lens.

The axial bearing faces 60 of the blocks 59 offer the lens 10 a seating in a plane which is parallel to the top face 55 of the base disk 51 and which is slightly raised above it. The bottom face of the lens 10 is therefore held at a distance from the top face 55 of the base disk 51.

Figure 14:
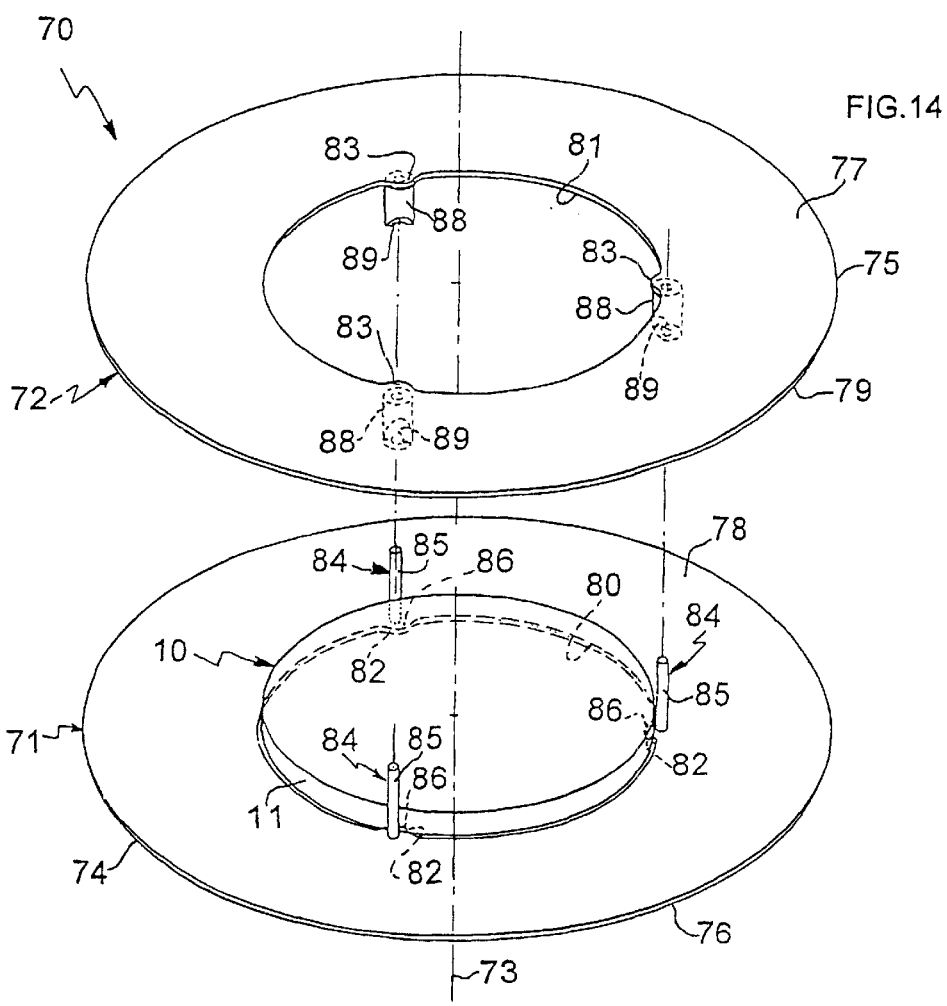
FIG. 14 is an exploded perspective view of an optical lens support in a ninth embodiment of the invention, in which the lens is engaged between two bases with fixed studs.
Figure 15:
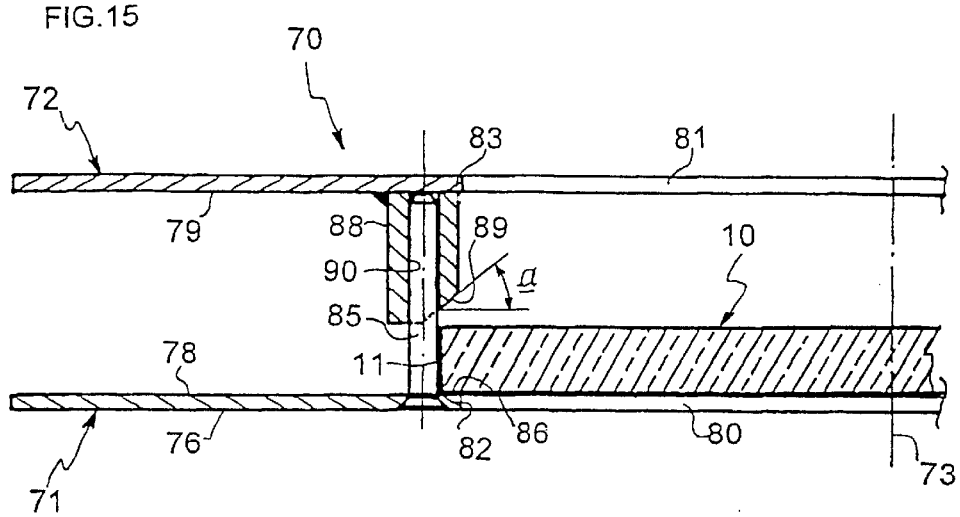
FIG. 15 is a half-view in section taken along an axial plane of the support from FIG. 14.
Figure 16:
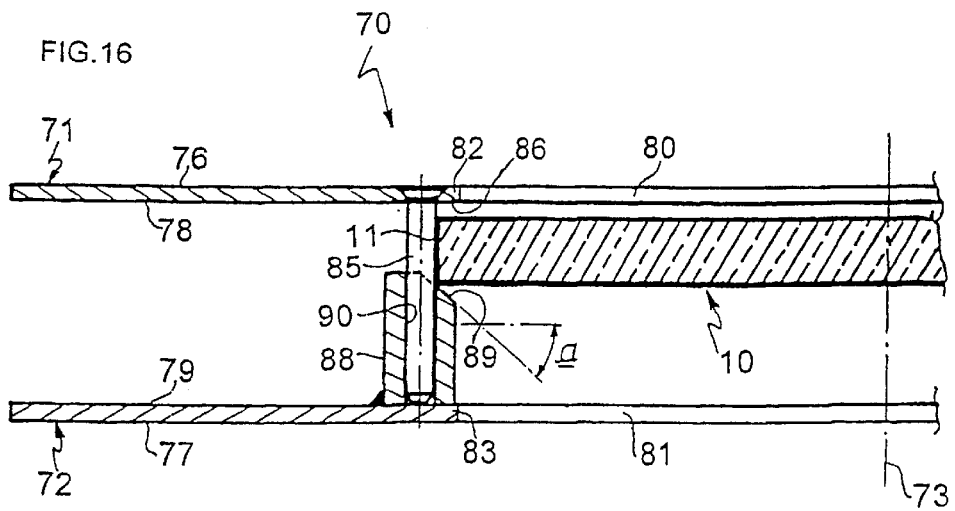
FIG. 16 is a view analogous to FIG. 15 with the support turned over, so that the second base is under the first base and the lens is resting on the axial bearing faces of the studs of the second base and is slightly spaced from the axial bearing faces of the studs of the first base.

FIGS. 14 to 16 show a further embodiment including two bases with fixed studs which sandwich the lens.

To be more precise, the support 70 includes a first generally disk-shaped base 71 and a second generally disk-shaped base 72.

In this instance, the two bases 71 and 72 are identical and have a common vertical central axis 73.

The bases 71, 72 have circular contours 74, 75 centered on the axis 73, first faces 76, 77 and second faces 78, 79 opposite the first faces.

The base disks 71, 72 also incorporate a central opening delimited by inside edges 80, 81 which are substantially circular, centered on the axis 73 and substantially the same shape and the same size as the lens 10.

The inside edges 80, 81 of the base disks 71, 72 are not strictly circular, however: they have rounded radial projections 82, 83, of which there are three in this instance, regularly distributed around the central axis 73.

The base disks 71, 72 have three fixed bearing studs for holding the lens 10 projecting from their second faces 78, 79 at the level of the radial projections 82, 83 on the inside edges of the bases 71, 72. However, the studs on the first base disk 71 are different from those on the second base disk 72.

The studs 84 on the first base disk 71 each comprise a lug 85 consisting of a cylindrical rod inset at one end into the base disk 71 and extending parallel to the central axis 73, i.e. vertically, and the corresponding projection 82 of the base disk 71. The lug 85 of each bearing stud 84 therefore has a cylindrical peripheral surface which constitutes a radial bearing face for the edge 11 of the lens 10. The peripheral surface of the lug 85 of each stud 84 constitutes the radial bearing face of the stud 84 concerned and is flush with an imaginary cylinder concentric with the axis 73 and containing the inside edge 80 of the base disk 71. The lens 10 is therefore accommodated between the lugs 85 of the studs 84 with virtually no radial clearance. The radial projections 82 on the first base disk 71 have an axial bearing face 86 continuous with the second face 78 of the base disk. The axial bearing surfaces 86 of the three projections 82 therefore offer the lens 10 a seating in a horizontal plane that is coincident with that of the second face 78 of the first base disk 71. It is therefore clear that the projections 82 of the base disk 71 are an integral part of the studs 84 for holding the lens 10.

The bearing studs on the second base disk 72 consist of posts 88 fixed by their base to the second face 79 of the second base disk 72 in line with the radial projections 83.

Each of the posts 88 has at the top, i.e. at the end opposite its base which is fixed to the base disk 72, an axial bearing face 89 which is beveled in this instance, i.e. which extends in a plane that is oblique to the faces 77, 79 of the second base disk 76, i.e. to the horizontal. In this instance, the beveled axial bearing face 89 is at an angle a of approximately 50° to the horizontal. The beveled axial bearing faces 89 of the three posts 88 converge toward the central axis 73 and toward the second base disks 72 to offer the lens 10 a pseudo-conical seating on which only its peripheral edge rests, as explained further below.

Each post 88 also has an axial housing adapted to receive with a small clearance the lug 85 of the corresponding stud 84 of the first base disk 71. The lugs 85 of the first base disk 71 and the posts 88 of the second base disk 72 therefore constitute homologous nesting means that assemble the two base disks 71 and 72 together in a precise relative position.

As shown in FIG. 14, the housings 90 of the posts 88 are open at both ends of the post and in particular at its base, where it opens onto the second face 79 of the second base disk 72. The face 79 therefore constitutes the end wall of the housing 90 of the posts 88.

In use, the double-base support that has just been described is assembled in the following manner.

The first base disk 71 is disposed in the configuration shown in FIG. 14, i.e. horizontal with its central axis 73 vertical and its bearing surface 76 facing downward.

The lens 10 is inserted between the lugs 85 so that it rests on the axial bearing faces 86 of the radial projections 82. In this state the bottom face of the lens 10, which has not yet been treated, and which is not yet the subject of any treatment, is locally in contact with the projections 82. That contact does not represent a penalty, however, because on the one hand it extends over a very small surface area and on the other hand the bottom face of the lens 10 is not coated with any surface treatment.

The second base disk 72 is then positioned so that it overlays the first disk 71, as shown in FIG. 14. To this end the second disk 72 is disposed horizontally, coaxially with the first disk 71, i.e. along the common central axis 73, with its bearing surface 77 facing upward, the faces 78 and 79 of the two base disks 71 and 72 facing each other. The second disk 72 is lined up angularly so that the housings 90 of the posts 88 are substantially aligned with the axes of the lugs 85 of the studs 84 of the first base disk 71. The posts 88 can then be threaded over the lugs 85. The free ends of the lugs 85 abut against the end wall of the housings 90 of the posts 88, i.e. against the face 79 of the second base disk 72, without the axial bearing surfaces 89 of the posts 88 coming into contact with the lens 10. The top face of the lens 10 is therefore protected from any contact with the second base disk 72.

The support assembly, i.e. the two superposed bases and the lens 10 between them, can then be placed on the turntable of spin coating apparatus, in the configuration shown in FIGS. 14 and 15, with the bearing surface 76 of the first base disk 71 resting on the turntable. The first face of the lens 10, which faces upward, can then be treated.

After treating the first face, the support assembly including the lens is turned over and the bearing surface 77 of the second base disk 72 is placed on the turntable of the spin coating apparatus. When the support is turned over, the lens 10, which has the benefit of some clearance between the seating planes formed by the axial bearing surfaces associated with the two bases, drops slightly so that it rests on the axial bearing faces 89 of the posts 88 of the second base disk 72. The second face of the lens, which is now facing upward, is then free of any contact with the first base disk 71.

The other face of the lens 10, which is now facing downward and has just been treated, rests on the beveled axial bearing faces 89 only along a line or at a point on its periphery. This face of the lens 10 is therefore protected from contact with the second base disk 72, as can be seen in FIG. 16. There is therefore no risk of damaging the surface treatment that has just been deposited on the bottom face of the lens 10.

The second face of the lens 10, which is facing upward, can then be treated.

What is claimed is:

1. An optical lens support comprising at least one first base, at least three bearing studs, carried by the at least one first base for holding an optical lens by its edge, said base having a planar bearing surface for seating the base and a globally circular peripheral contour, a radial dimension along any radius of the bearing surface being at least equal the axial dimension of said base perpendicular to the bearing surface thereof.

2. A support according to claim 1, wherein at least one of the three bearing studs is fixed relative to the base and at least one other stud of the three bearing studs is carried by an elastically deformable member carried by the base.

3. A support according to claim 2, wherein two of the three bearing studs are fixed and the at least one other bearing stud is carried by the elastically deformable member.

4. A support according to claim 3, wherein the elastically deformable member comprises an elastic arm having a root anchored in one of the two fixed bearing studs.

5. A support according to claim 2, wherein each of two other bearing studs is carried by a respective elastically deformable member, the at least one bearing stud being fixed.

6. A support according to claim 2, wherein the at least one other stud carried by an elastically deformable member is in one piece therewith.

7. A support according to claim 4, wherein the elastically deformable member comprises an arm bent between the root and the at least one other bearing stud carried thereby.

8. A support according to claim 2, wherein the elastically deformable member comprises a leaf spring whose width is perpendicular to the planar bearing surface of the base.

9. A support according to claim 2, wherein the base has a central opening, the at least one fixed bearing stud is at the border of the central opening, and the at least one bearing stud carried by an elastically deformable member is inside the contour thereof.

10. A support according to claim 9, wherein the bearing studs are located opposite each other on the base.

11. A support according to claim 2, wherein at least one of the bearing studs has at least one localized notch.

12. A support according to claim 2, wherein at least one of the bearing studs has notches over its entire height.

13. A support according to claim 2, wherein the bearing studs are operative in the absence of a lens along a circumference that is eccentric to the peripheral contour of the bearing surface of the base, the center of the circumference being closer to the at least one fixed bearing stud than the center of the peripheral contour.

14. A support according to claim 1, wherein the at least three bearing studs are fixed to the base and each has a radial bearing face and an axial bearing face, the axial bearing faces of the studs defining a seating for the periphery of the lens in a predetermined plane parallel to the planar bearing surface of the base.

15. A support according to claim 14, wherein the base is disc-shaped, one face of the base constitutes the planar bearing surface for seating the base and the other face of the base having the at least three bearing studs projecting therefrom.

16. A support according to claim 15, wherein the base comprises a disc devoid of a central opening, the seating plane defined by the axial bearing faces of the studs is proximate to the other face of the base.

17. A support according to claim 15, wherein the base is disc-shaped with a central opening delimited by an inside edge substantially of the same shape and substantially of the same size as a lens adapted to be supported by the bearing studs, each of the bearing stud comprising two parts, a first of the parts projecting from the other face of the base and featuring the radial bearing face of the respective stud and a second part projecting radially the inside edge of the base.

18. A support according to claim 17, wherein the second part of each stud is in one piece with the base.

19. A support according to claim 14, wherein the axial bearing faces of the studs are beveled and converge toward inwardly and toward the base.

20. A support according to claim 14 further comprising a second base similar to the first base and having at least three bearing studs for holding a lens, and a planar bearing surface for seating the base, and a globally circular peripheral contour, a radial dimension along any radius of the planar bearing surface being at least equal to its axial dimension perpendicular to the planar bearing surface thereof, the studs of the second base having axial bearing faces for seating a lens in a plane parallel to the planar bearing surface of the second base, and the first and second bases being assembled together in a superposed arrangement, the planar bearing surface of each base facing away from the other base, so that seatings defined by the axial bearing faces of the studs of the two bases sandwich the periphery of a lens.

21. A support according to claim 20, wherein the two seating planes defined by the axial bearing faces of the studs of the first and second bases are separated by a distance slightly greater than the thickness of a lens to be received for defining some axial clearance for a lens between the two seating planes.

22. A support according to claim 20 wherein two bases are assembled by bearing studs.

23. A support according to claim 22, wherein the bearing studs of the first base each include a lug extending axially away from the bearing surface of the base and carrying the radial bearing face of the respective stud, and the studs of the second base each comprising a post carrying the axial bearing face of the respective stud and providing an axial recess for receiving the lug of a corresponding stud of the first base.

24. A support according to claim 22 wherein the distance between the first and second bases and the seating planes defined by the axial bearing faces of the respective studs is determined by abutment of the free ends of the lugs of the studs on the first base against an end wall of recesses of the posts of the studs of the second base.

25. A support according to claim 24, wherein the recesses of the posts of the studs of the second base have an open end, the end wall of the recess of each post including of a surface of the second base, from which said post extends.

26. A support according to claim 20, wherein the axial bearing faces of the studs of the second base are beveled.

27. A support according to claim 20, wherein each of the two bases is disc-shaped with a central opening defined by an inside edge substantially of the same shape and substantially of the same size as a lens adapted therefor.

28. In a spin-coating apparatus including a turntable incorporating suction orifices, the improvement comprising an optical lens support, the lens support including at least one first base, at least three bearing studs, carried by the at least one first base for holding an optical lens by its edge, said base having a planar bearing surface for seating the base and a globally circular peripheral contour, a radial dimension along any radius of the bearing surface being at least equal the axial dimension of said base perpendicular to the bearing surface thereof, the planar bearing surface being cooperable with the turntable for holding the base on the turntable.

* * * * *